United States Patent
Chen et al.

(10) Patent No.: US 6,588,123 B2
(45) Date of Patent: Jul. 8, 2003

(54) APPARATUS AND METHOD FOR PREVENTING A WAFER MAPPING SYSTEM OF AN SMIF SYSTEM FROM BEING POLLUTED BY CORROSIVE GASES REMAINING ON WAFERS

(75) Inventors: San-Pen Chen, Pengtung (TW); Shun-Lian Wu, Chu-Tung (TW); William Wang, Chu-Pei (TW)

(73) Assignee: Promos Technologies, Inc., Hsinchu (TW)

( * ) Notice: Subject to any disclaimer, the term of this patent is extended or adjusted under 35 U.S.C. 154(b) by 76 days.

(21) Appl. No.: 10/004,680

(22) Filed: Dec. 5, 2001

(65) Prior Publication Data

US 2003/0101615 A1 Jun. 5, 2003

(51) Int. Cl.$^7$ .................................................. F26B 7/00
(52) U.S. Cl. ............................... 34/389; 34/582; 34/85; 414/217.1; 414/291; 414/935
(58) Field of Search .......................... 34/360, 380, 389, 34/487, 582, 85; 141/85; 414/217.1, 288, 291, 935

(56) References Cited

U.S. PATENT DOCUMENTS 6,368,411 B2 * 4/2002 Roberson, Jr. et al. ..... 118/715
6,425,722 B1 * 7/2002 Ueda et al. ................. 414/217

* cited by examiner

Primary Examiner—Pamela A. Wilson
(74) Attorney, Agent, or Firm—Ladas and Parry

(57) ABSTRACT

An apparatus and a method for preventing a wafer mapping system of an SMIF system from being polluted by a corrosive gas remaining on wafers according to the present invention are disclosed. The wafer mapping system includes a plurality of mirrors and sensors used to detect the positions of the wafers. The apparatus of the prevent invention comprises a pipe having a plurality of holes thereon and a purge gas flowing inside the pipe, and is characterized in that the purge gas is emitted out from the plurality of holes toward the mirrors of the wafer mapping system, thereby preventing the mirrors from being polluted by the corrosive gas remaining on the wafers. The method of the prevent invention is characterized by emitting a purge gas from a pipe toward the mirrors of the wafer mapping system, thereby preventing the mirrors from being polluted by the corrosive gas remaining on the wafers.

10 Claims, 2 Drawing Sheets

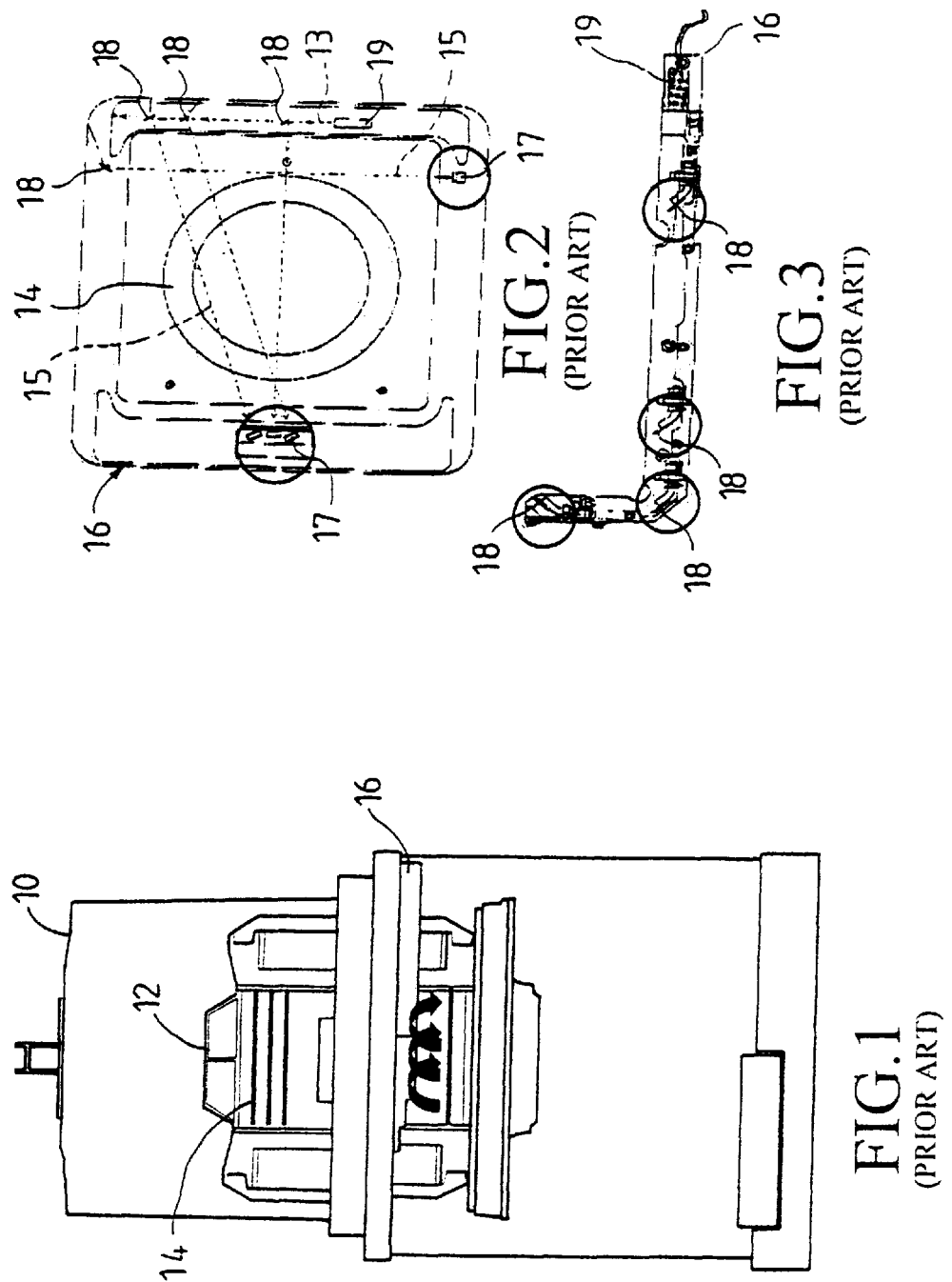

APPARATUS AND METHOD FOR PREVENTING A WAFER MAPPING SYSTEM OF AN SMIF SYSTEM FROM BEING POLLUTED BY CORROSIVE GASES REMAINING ON WAFERS

BACKGROUND OF THE INVENTION

1. Field of the Invention

The present invention relates to an SMIF system, more particularly to an apparatus and a method for preventing a wafer mapping system of an SMIF system from being polluted by corrosive gas remaining on wafers.

2. Description of the Related Art

It is well-known in semiconductor industry that an SMIF system is used to reduce particle fluxes onto semiconductor wafers during storage and transportation of the wafers through the semiconductor fabrication process. This purpose is accomplished, in part, by mechanically ensuring that during storage and transportation, the gaseous media (such as air or nitrogen) surrounding the wafers is -essentially a stationary relative to the wafers, and by ensuring that particles from the ambient environment do not enter in the immediate wafer environment.

FIG. 1 shows a schematic front view of a conventional SMIF system 10 in which reference numeral 12 designates a cassette, 14 designates wafers stored in the cassette 12, and 16 designates a wafer mapping system. During fabrication, semiconductor wafers may undergo more than 300 process steps before the wafer is cut into individual integrated circuit chips, and the wafers must be transferred to and from an SMIF pod in each of these process steps. Each time a group of wafers are removed from and returned to a pod for the individual process, there is a danger that one or more of the wafers will be damaged or destroyed because the wafers are improperly positioned. Silicon semiconductor wafers are extremely valuable, with each wafer costing up to one-thousand US dollars. More significantly, as devices are formed on the wafer surfaces, the worth of a particular lot of wafers within a pad may exceed one-million dollars. It is therefore critical to avoid damage or loss to the wafers during fabrication.

In order to prevent damage due to improper position of wafers and in order to avoid a waste of time accessing dummy wafers, the wafer mapping system 16 is used to detect the presence and position of wafers in wafer slots. This information may then be stored, as in a computer memory, to provide a wafer map for a particular pod or SMIF pod for later use. Referring to FIG. 2, a top view of the wafer mapping system 16 is shown. The wafer mapping system 16 includes sensors 17 and mirrors 18 and a laser 19. FIG. 3 shows a schematic enlarged view of a part of the wafer mapping system 16 including the mirrors 18 and laser 19. The laser 19 functions as a transmitter while the sensors functions as a receiver. Moreover, the mirrors 18 are used to reflect and/or split a light 13 emitted from the laser 19. During the operation, the sensors 17 receive lights 15 coming from the mirrors 18 with the wafers 14 therebetween, thereby detecting the presence and positions of the wafers 14.

However, the mirrors 18 may be polluted by corrosive gases remaining on the wafers 14, causing changes to the refractive indexes of the mirrors 18, even damages to the mirrors 18. Under this condition, the lights coming from the mirrors 18 will deviate from the original paths. As a result, the presence and positions of the wafers cannot be precisely detected.

SUMMARY OF THE PRESENT INVENTION

In view of the above, an object of the present invention is to provide an apparatus for preventing a wafer mapping system of an SMIF system from being polluted by a corrosive gas remaining on wafers. The wafer mapping system includes a plurality of mirrors and sensors used to detect the positions of the wafers. The apparatus of the present invention includes a pipe having a plurality of holes thereon and a purge gas flowing inside the pipe, and is characterized in that the purge gas is emitted out from the plurality of holes toward the mirrors of the wafer mapping system, thereby preventing the mirrors from being polluted by the corrosive gas remaining on the wafers.

The apparatus of the present invention further includes a plurality of valves for controlling the amount of the purge gas flowing inside the pipe and an outlet for allowing the emitted purge gas to be exhausted out of the SMIF system.

Another object of the present invention is to provide a method for preventing a water mapping system of an SMIF system from being polluted by a corrosive gas remaining on wafers. The water mapping system includes a plurality to mirrors and sensors used to detect the positions of wafers. The method of the present invention is characterized by emitting a purge gas from a pipe toward the mirrors of the wafer mapping system, thereby preventing the mirrors from being polluted by the corrosive gas remaining on the wafers.

In the method of the prevent invention, the amount of the purge gas emitted is controllable by a plurality of valves, and the emitted purge gas can be exhausted out of the SMIF system through an outlet.

BRIEF DESCRIPTION OF THE DRAWINGS

FIG. 1 shows a schematic front view of a conventional SMIF system;

FIG. 2 shows a schematic top view of a wafer mapping system included in the conventional SMIF system of FIG. 1;

FIG. 3 shows a schematic enlarged view of a part of the wafer mapping system including mirrors and a laser;

LIST OF REFERENCE NUMERALS FOR MAJOR ELEMENTS

10 SMIF system
12 Cassette
14 Waters
16 Waler Mapping System
17 Sensors
18 Mirrors
19 Sensors
20 Apparatus for Preventing a Wafer Mapping system from Being Polluted
21 Pipe
22 Outlet
23 Holes
25 Valves
30 SMIF system

DETAILED DESCRIPTION OF THE EMBODIMENTS

Figure 4:
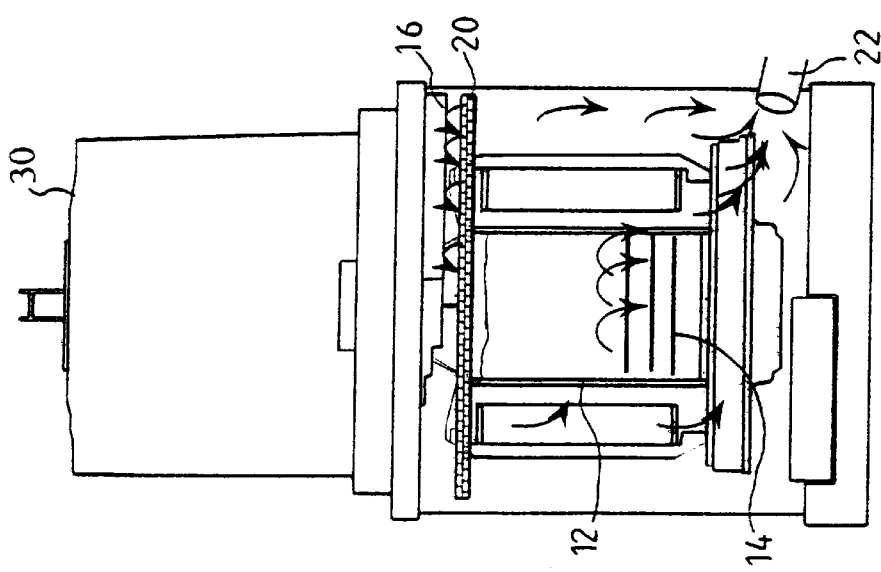
FIG. 4 shows a schematic front view of a SMIF system according to the present invention.

FIG. 4 shows a schematic front view of an SMIF system 30 according to the present invention. The SMIF system 30 includes a cassette 12 having wafers 14 stored therein, a wafer mapping system 16 and an apparatus 20 for preventing the wafer mapping system 16 from being polluted by a corrosive gas remaining on the wafers 14.

Figure 5:
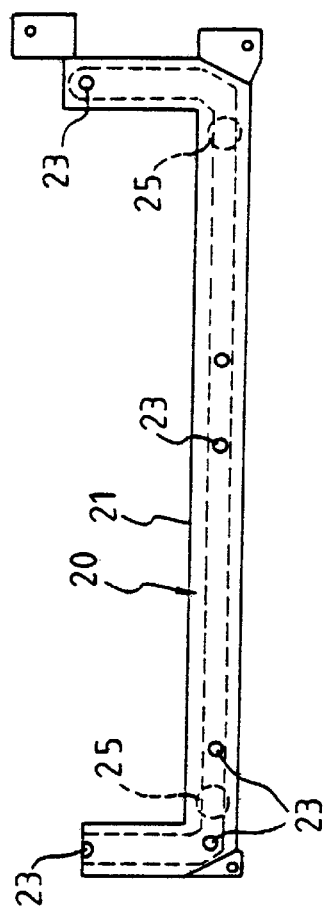
FIG. 5 shows a schematic top view of an apparatus for preventing the wafer mapping system of the SMIF system from being polluted by corrosive gases remaining on wafers.
Figure 6:
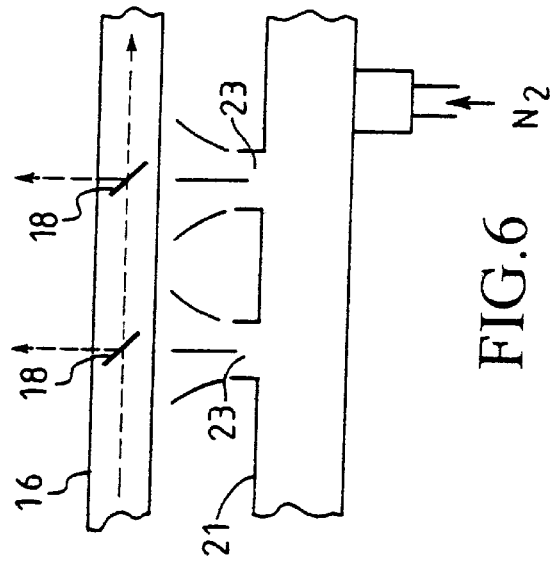
FIG. 6 shows a schematic fragmentary view of an apparatus and a wafer mapping system.

Referring to FIG. 5, the apparatus 20 for preventing the wafer mapping system 16 from being polluted includes a pipe (for example, PVC pipe) 21 located under the wafer mapping system 16, having a plurality of holes 23 thereon and a purge gas (for example, $N_2$ gas) flowing inside the pipe 21. FIG. 6 shows a schematic fragmentary view of the apparatus 20 and the wafer mapping system 16. In FIG. 6, the $N_2$ gas is emitted from the plurality of holes 23 toward mirrors 18 of the wafer mapping system 16 to create more positive pressure around the mirrors 18 than other regions. At this time, the corrosive gas remaining on the wafers 14 cannot move toward the mirrors 18 due to the presence of the positive pressure created, thereby preventing the mirrors 18 from being polluted by the corrosive gas.

Moreover, as shown in FIG. 5, the apparatus 20 further includes a plurality of valves 25 for controlling the amount of the $N_2$ gas flowing inside the pipe 21. With such valves, the apparatus 20 can optimally prevent the water mapping system from being polluted by the corrosive gas remaining on the wafers 14. Referring back to FIG. 4, the apparatus 20 further includes an outlet 22 for exhausting the emitted N, gas out of the SMIF system 30.

According to the present invention, a method for preventing a wafer mapping system of an SMIF system from being polluted by a corrosive gas remaining on wafers is provided. The wafer mapping system includes a plurality of mirrors and sensors used to detect the positions of wafers. The method of the present invention is characterized by emitting a purge gas (for example, $N_2$ gas) from a pipe (for example, PVC pipe) toward the mirrors of the wafer mapping system, thereby preventing the mirrors from being polluted by the corrosive gas remaining on the wafers. In the method, the purge gas flowing inside the pipe is controlled by a plurality of valves so as to optimally prevent the mirrors of the wafer mapping system from being polluted by the corrosive gas.

In summary, an apparatus and a method of the present invention can efficiently prevent a wafer mapping system of an SMIF system from being polluted by the corrosive gas remaining on wafers. In other words, with such apparatus and method of the present invention, the wafer mapping system can normally operate to precisely detect the presence and positions of the wafers. Consequently, the wafers will not be damaged or destroyed due to the wafers improperly positioned.

Although the invention has been disclosed in terms of preferred embodiments, the disclosure is not intended to limit the invention. Those knowledgeable in the art can make modifications within the scope and spirit of the present invention which is determined by the claims below.

What is claimed is:

1. An apparatus for preventing a wafer mapping system of an SMIF system from being polluted by a corrosive gas remaining on wafers, the wafer mapping system including a plurality of mirrors and sensors used to detect the positions of wafers, the apparatus comprising a pipe having a plurality of holes thereon and a purge gas flowing inside the pipe, characterized in that:

the purge gas is emitted out from the plurality of holes toward the mirrors of the wafer mapping system, thereby preventing the mirrors from being polluted by the corrosive gas remaining on the wafers.

2. The apparatus as set forth in claim 1, further comprising a plurality of valves for controlling the amount of the purge gas flowing inside the pipe.

3. The apparatus as set forth in claim 1, further comprising an outlet for allowing the emitted purge gas to be exhausted to the outside of the SMIF system.

4. The apparatus as set forth in claim 1, wherein the pipe is located under the wafer mapping system.

5. The apparatus as set forth in claim 1, wherein the purge gas is an $N_2$ gas.

6. A method for preventing a wafer mapping system of an SMIF system from being polluted by a corrosive gas remaining on wafers, the wafer mapping system including a plurality of mirrors and sensors used to detect the positions of wafers, the method characterized by the step of emitting a purge gas from a pipe toward the mirrors of the wafer mapping system, thereby preventing the mirrors from being polluted by corrosive gas remaining on the wafers.

7. The method as set forth in claim 6, further comprising the step of controlling the amount of the purge gas by a plurality of valves.

8. The method as set forth in claim 6, further comprising the step of exhausting the purge gas out of the SMIF system through an outlet.

9. The method as set forth in claim 6, wherein the pipe is located under the wafer mapping system.

10. The method as set forth in claim 6, wherein the purge gas is an $N_2$ gas.

* * * * *